(12) United States Patent
Soyano

(10) Patent No.: US 6,396,125 B1
(45) Date of Patent: May 28, 2002

(54) SEMICONDUCTOR DEVICE

(75) Inventor: Shin Soyano, Nagano (JP)

(73) Assignee: Fuji Electric Co., Ltd., Kawasaki (JP)

( * ) Notice: Subject to any disclaimer, the term of this patent is extended or adjusted under 35 U.S.C. 154(b) by 0 days.

(21) Appl. No.: 09/624,555

(22) Filed: Jul. 24, 2000

(30) Foreign Application Priority Data

Aug. 6, 1999 (JP) ............................................ 11-223304

(51) Int. Cl.[7] ............................................ H01L 27/082
(52) U.S. Cl. ........................................ 257/565; 257/47
(58) Field of Search ............................... 361/707, 736, 361/704; 439/495; 257/723, 675, 47, 197, 370, 565

(56) References Cited

U.S. PATENT DOCUMENTS

| | | | | |
|---|---|---|---|---|
| 5,398,160 A | * | 3/1995 | Umeda | 361/707 |
| 5,474,468 A | * | 12/1995 | Chishima et al. | 439/495 |
| 5,625,536 A | * | 4/1997 | Soyano et al. | 361/736 |
| 5,703,399 A | * | 12/1997 | Majumdar et al. | 257/723 |
| 5,767,573 A | * | 6/1998 | Noda et al. | 257/675 |
| 5,942,797 A | * | 8/1999 | Terasawa | 257/723 |
| 6,201,696 B1 | * | 3/2001 | Shimizu et al. | 361/704 |

FOREIGN PATENT DOCUMENTS

| | | |
|---|---|---|
| EP | 0 825 649 | 2/1998 |
| JP | 11-16937 | 1/1999 |

OTHER PUBLICATIONS

Abstract of Japan, Publication No. 09232479, Publication Date Sep. 5, 1997.

* cited by examiner

Primary Examiner—David Nelms
Assistant Examiner—Bau T Le
(74) Attorney, Agent, or Firm—Kanesaka & Takeuchi

(57) ABSTRACT

A semiconductor device is formed of a casing, a semiconductor element disposed in the casing, and a control terminal assembly situated outside the casing. The control terminal assembly includes control terminals connected to the semiconductor element, and slit-shape openings at at least two sides adjacent to each other for receiving therein projecting terminals of a connector. Since the terminals of the control terminal assembly are contained in a housing, deformation of the terminals due to external force is avoided, and mis-engagement in connection with the projecting terminal does not occur, and electrostatic break down of an element in the power module during handling is also prevented.

8 Claims, 4 Drawing Sheets

SEMICONDUCTOR DEVICE

BACKGROUND OF THE INVENTION AND RELATED ART STATEMENT

The present invention relates to a semiconductor device including a power device, a driving circuit and a protective circuit, integrated in a package, and having main terminals for treating high currents, and control terminals for treating control signals.

Power devices are applied to power electronic apparatuses, such as general-purpose inverters, uninterruptive power supplies, machine tools, and industrial robots. In the power devices, an insulated gate bipolar transistor (IGBT) has become dominant. Further, an intelligent power module has been used practically, in which the driving circuit and the protective circuit in addition to the IGBT are integrated in a module, and high performance and function are achieved.

Such a power module comprises a power switching circuit including a combination of multiple IGBT chips, a driving circuit for driving the IGBTs, and a protective circuit for protection from overcurrent, short circuiting and overheating. These circuits are mounted in a casing and are connected to terminals formed outside the casing. An intelligent power module used for driving a three-phase motor, for example, is provided with terminal blocks P and N for DC power input, terminal blocks U, V and W for output, a terminal block B for braking, and a control terminal assembly for control signals on the peripheral of the module. The control terminal assembly comprises a plurality of pins or plate tabs each being connected to the driving circuit or the protective circuit, and an insulative terminal block for holding the pins or the tabs. The terminal block is joined with the casing by secondary molding, adhesion or screwing.

In using the intelligent power module to an application apparatus, main circuits of the apparatus are attached to the terminal blocks of the power module by screwing. Control circuits, on the other hand, are attached to the power module by directly soldering a power board of the apparatus mounting a control integrated circuit to the pins or tabs projecting from the terminal block of the power module, or by inserting the pins or tabs projecting from the terminal block of the power module into a connector connected to or attached to the power board.

Since the terminals for control signals in conventional semiconductor devices project from the device, it is liable to be deformed by external force in a production process or transportation after production. In an automatic mounting by a robot, for example, if accuracy of a dimension, such as pitch of the terminals, is not enough, mis-engagement with the connector of the power board may occur and the connector may break. In addition, when the connector is attached to the control terminals of the semiconductor device, the connector must be inserted while moving in the direction of projection of the control terminals from the semiconductor device.

Moreover, since the control terminals are exposed from the semiconductor device, the control terminals may be unintentionally touched by hand, to sometimes cause electrostatic break down of the elements in the semiconductor device.

In view of the foregoing, it is an object of the present invention to provide a semiconductor device comprising control terminals that avoid mis-engagement in connection with a power board, and that eliminate direct touching with hand.

SUMMARY OF THE INVENTION

To attain the above object, the present invention provides a semiconductor device comprising in a casing, a power device, and a driving circuit and a protective circuit for the power device. The semiconductor device further comprises a control terminal assembly including control terminals for control signals leading out from the driving circuit and the protective circuit to outside of the casing. The control terminal assembly has a receptacle-type connector that receives pin- or tab-shape terminals.

Such a semiconductor device, in which the control terminal assembly of the semiconductor device has a receptacle-type connector, prevents the control terminals directly connected to the inner circuit elements from projecting or exposing out of the casing. Therefore, the control terminals of the control terminal assembly are not subjected to any force in transportation and are not likely to deform. In addition, the control terminals are never directly touched by hand, and therefore, the elements in the semiconductor device are not electrostatically broken down in handling the device.

DETAILED DESCRIPTION OF PREFERRED EMBODIMENTS

Now, the present invention will be explained in detail with respect to preferred embodiments applied to a specific IGBT intelligent power module as examples, referring to accompanying drawings.

Figure 1:
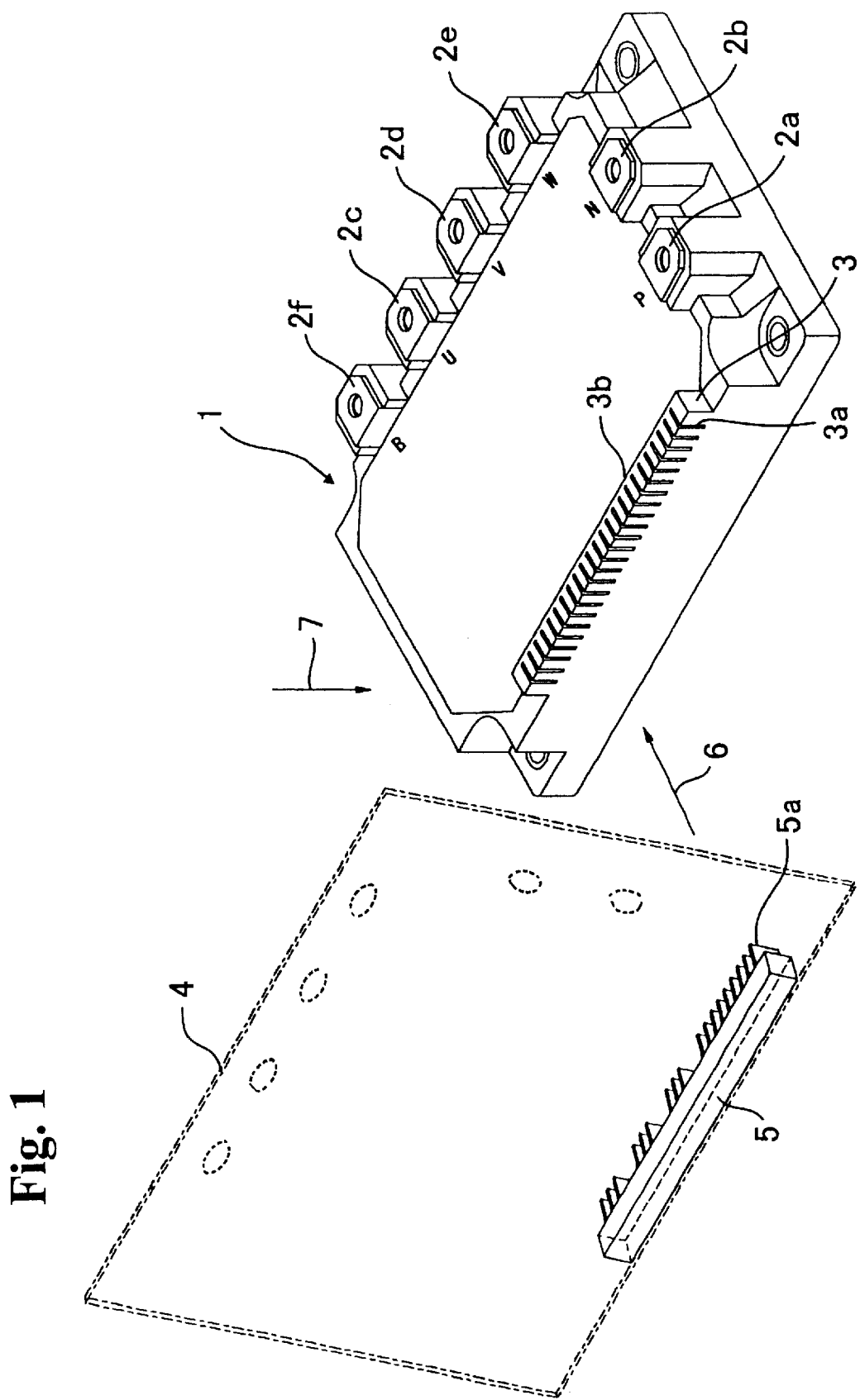
FIG. 1 is a perspective view showing a connection relationship between a power module and a power board.

FIG. 1 is a perspective view showing a connection relationship between a power module and a power board in the invention. An IGBT intelligent power module 1 has, on the outer peripheral surface of the casing thereof, terminal blocks 2a and 2b for P and N of DC power input, terminal blocks 2c, 2d and 2e for U, V and W of output, and a terminal block 2f for B of braking, as external terminals of a main circuit, and a control terminal assembly 3 for control signals.

The control terminal assembly 3 is a receptacle-type connector, and comprises a connector housing 3b and control terminals arranged in the connector housing 3b. The connector housing 3b is provided with a plurality of slit-shape openings 3a arranged in a longitudinal direction with a predetermined spacing and suitable for receiving male terminals of pins or tabs from the outside, and the control terminals are arranged in the connector housing 3b corresponding to each of the openings 3a. The control terminal assembly forms a terminal block. The connector housing 3b may be formed integrally with the casing of the power module 1, or by secondary molding with the casing. Alternatively, a separately formed terminal block may be fixed to the casing by adhesion or screwing.

The openings 3a of the control terminal assembly 3 are directed to two directions, upward and sideways. Thus, the direction of putting in and pulling out of male terminals to or from the connector housing 3b can be made in both vertical and horizontal directions.

For a power board 4 to be connected to this power module 1, a connector 5 of the power board 4 is provided with terminals of pin or tab type. The example of the connector shown in FIG. 1 has a plurality of tab type terminals 5a. The power board 4 is attached to the IGBT intelligent power module 1 by engaging and connecting such a connector 5 to the control terminal assembly 3. At this time, the power board 4 is moved toward the power module 1, as shown by arrow 6, with a standing condition, and the terminals 5a of the connector 5 are inserted into the openings 3a in the side face of the control terminal assembly 3. In the condition that the terminals 5a are inserted in the control terminal assembly 3, the power board 4 is pushed down onto the power module 1 while being pivoted at the insertion points. After the power board becomes horizontal, the power board 4 is moved in the direction of the arrow 6 until the terminals 5a of the connector 5 contact the edges of the openings 3a of the control terminal assembly 3. Thus, the power board 4 is positioned on the power module 1. After that, the power board 4 is fixed to the terminal blocks 2a through 2f with screws (not shown). Thus, fitting of the power board 4 to the power module 1 is finished.

When the connector 5 is situated on the side of the fitting face, as in this case, the terminals 5a of the connector can not be directly seen due to the power board 4 at the time of fitting the connector 5 to the control terminal assembly 3. However, because in the power module 1 according to the invention, the terminals 5a of the connector can be engaged with the control terminal assembly 3 while the power board is standing upright as explained above, the fitting is conducted securely and quickly without mis-engagement.

The terminals 5a of the connector 5 may be approached from above with the power board standing upright, and inserted to the openings 3a of the control terminal assembly 3, followed by tilting the power board 4 while pivoting at the insertion points.

When the relative position between the power board 4 and the power module 1 is accurate as in the case of assembling by a robot, the terminals 5a of the connector 5 may be inserted into the control terminal assembly 3 in the condition that the power board 4 is kept horizontal throughout the insertion process.

Figure 2:
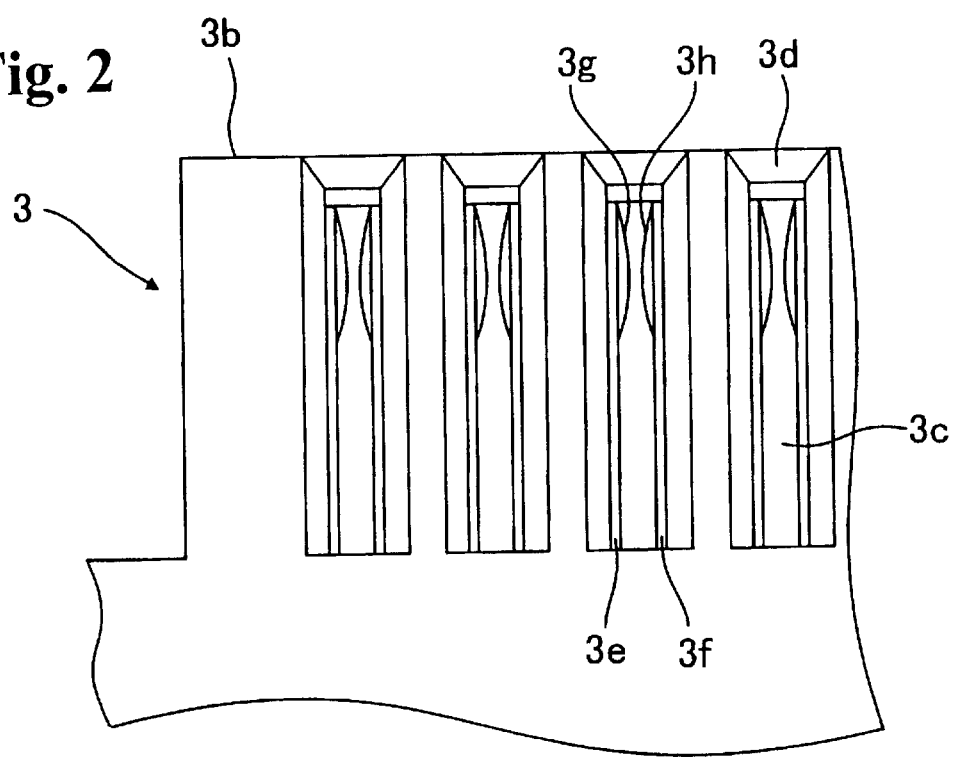
FIG. 2 is a partially enlarged side view of a control terminal assembly.

FIG. 2 is a partly enlarged side view of the control terminal assembly. The control terminal assembly 3 comprises slit-shaped openings 3c and 3d on the side face and the upper face of the connector housing 3b. Each of the openings 3c and 3d has a width larger than a thickness of the terminal 5a of the connector 5, and the width around the entrance of the openings is tapered to be narrower in the inner part. Two contact plates 3e and 3f are disposed opposite to each other in each space of the openings 3c and 3d to be inserted by the terminal 5a of the connector 5. Each of the contact plates 3e and 3f is favorably formed by folding a metal sheet into a U-shape. Further, the contact plates 3e and 3f preferably include protrusions 3g and 3h protruding to the inside of the opposite faces of the contact plates.

When the terminals 5a of the connector 5 are pushed into the control terminal assembly 3 in the vertical or horizontal direction, the terminals 5a are inserted slidingly on the protrusions 3g and 3h of the contact plates 3e and 3f. The inserted terminal 5a is caught between the protrusions 3g and 3h of the contact plates 3e and 3f, to perform mechanical and electrical connections between the connector 5 and the control terminal assembly.

Figure 3:
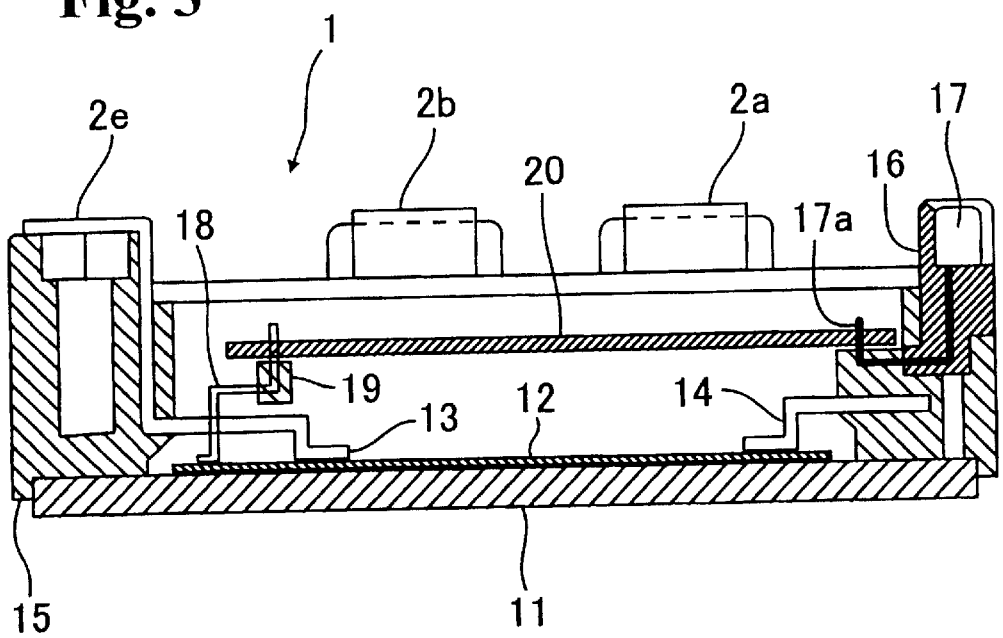
FIG. 3 is a cross sectional view of an example of an inner structure of a power module.

FIG. 3 is a cross sectional view showing an example of the inner structure of a power module of the invention. The IGBT intelligent power module 1 comprises a metal base 11, a ceramic substrate 12 fixed on the metal base, and a plurality of semiconductor chips, such as IGBTs, freewheeling diodes and the like mounted on the ceramic substrate via a circuit pattern. Main circuit electrodes, such as collector and emitter, of the IGBT chip are connected to the terminal block 2e via a terminal 13 and to the terminal block 2a via a terminal 14. The terminals 13 and 14 are preferably formed integrally with the terminal blocks 2e and 2a, respectively.

A casing 15 disposed over the periphery of the metal base 11 supports the terminals 13 and 14 connected to the terminal blocks 2e and 2a, and holds a terminal block 16 having a contact plate therein. The terminal block 16 in this example is fixed to the casing 15 by secondary molding with the casing, or a separately formed terminal block 16 is bonded to the casing 15 with an adhesive.

The terminal block 16 holds a contact plate 17 and a terminal 17a integrally formed with the contact plate 17. An end of the terminal 17a projects upward in the inside of the casing 15. A terminal holder 19 supporting a terminal 18 is fixed to the casing 15 within the casing. One end of the terminal 18 is connected to an electrode, such as a control electrode, that is, a gate of the IGBT chip mounted on the ceramic substrate 12, or an electrode for overcurrent detection or temperature detection. The other end of the terminal 18 and the terminal 17a supported by the terminal block are soldered to a printed circuit board 20. The printed circuit board 20 has an integrated circuit thereon including an interface circuit with the terminal 17a from the terminal block 16, a driving circuit for the IGBT chips and a protective circuit, for example.

In case a circuit having a function equivalent to that of the printed circuit board 20 is mounted on the ceramic substrate 12, the terminal 17a from the terminal block 16 is directly connected to the chip on the ceramic substrate 12.

Figure 4:
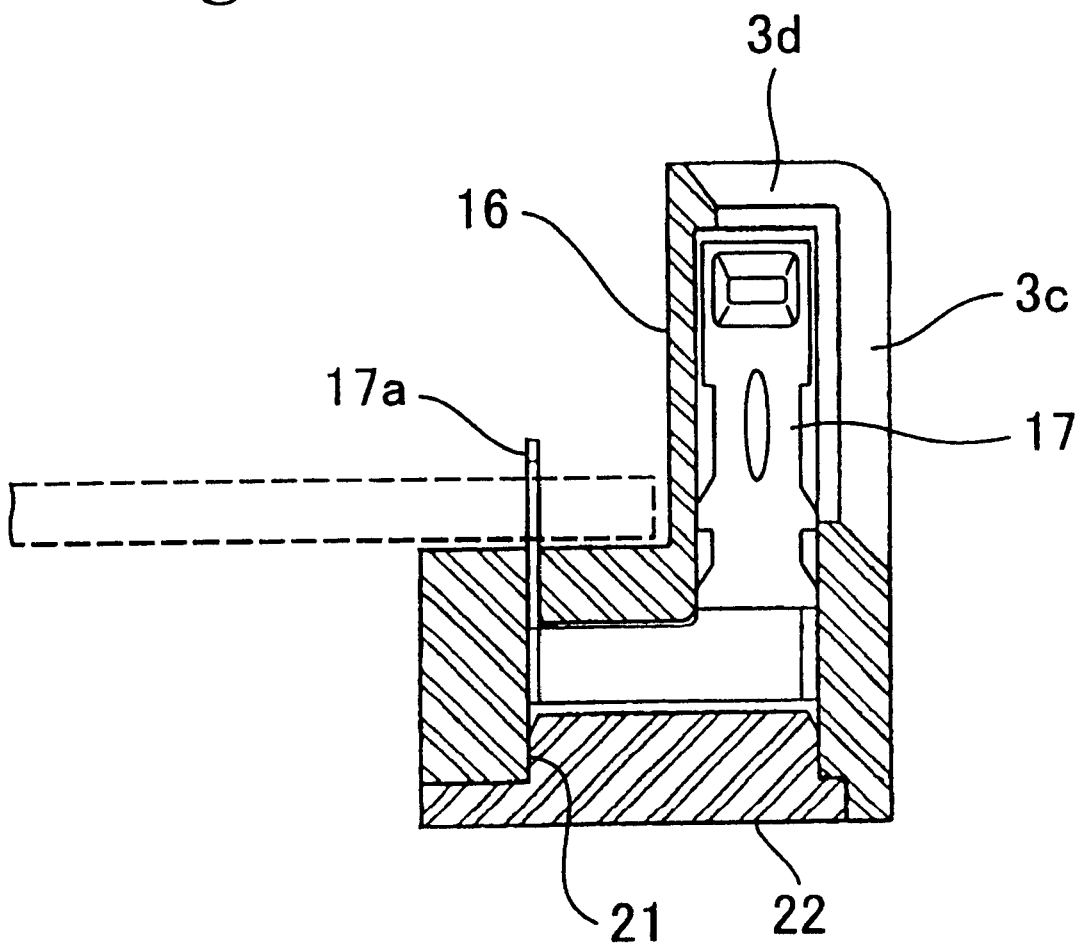
FIG. 4 is a cross sectional view showing another example of a structure of a terminal block.

FIG. 4 is a cross sectional view showing another construction of the terminal block. The terminal block 16 comprises an opening 21 at a bottom thereof, through which the contact plate 17 and the terminal 17a are inserted into the terminal block 16 and pushed toward a space continuing to the openings 3c and 3d to assemble together. After the contact plate 17 and the terminal 17a are put in place, the opening 21 is closed by a plug 22 to separate the space containing the contact plate 17 and the terminal 17a in the terminal block from the space inside the casing 15. Such a structure prevents silicone gel or uncured epoxy resin for filling the inner space of the casing 15 from oozing out to the space inside of the terminal block 16, to avoid imperfect contact at the contact plate 17 due to the silicone gel or the epoxy resin.

Figure 5:
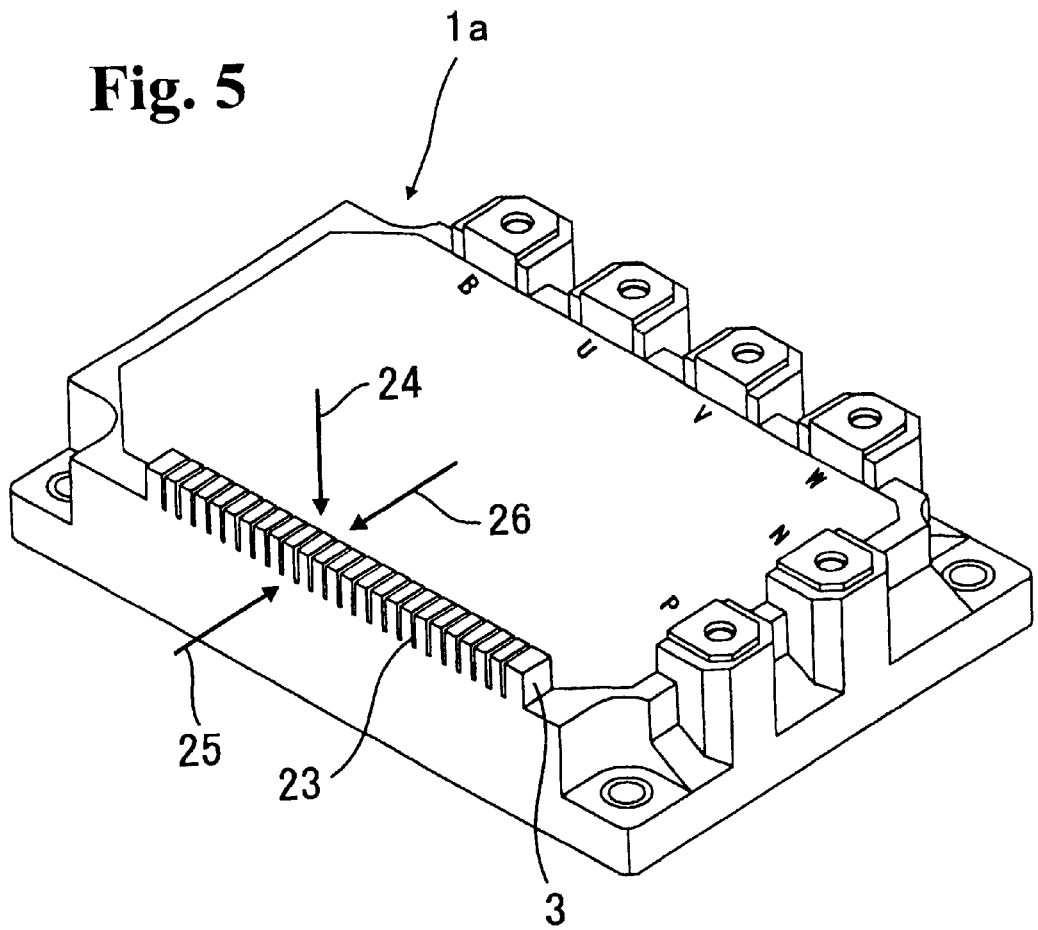
FIG. 5 is a schematic perspective view of a power module provided with another control terminal assembly.

FIG. 5 is a schematic perspective view of a power module provided with another control terminal assembly. An example of an IGBT intelligent power module 1a comprises a control terminal assembly 3 having openings 23 in three faces, i.e. two side faces and an upper surface, to insert terminals of a male connector.

When the connector terminals of a power board is fitted to the power module 1a, the control terminal assembly 3 allows the connector terminals inserted from the three directions, i.e. vertically from above as indicated by arrow 24, horizontally from outside as indicated by arrow 25, and horizontally from inside as indicated by arrow 26. The connector terminals may be inserted not only from the above-indicated orthogonal three directions, but also from any tilted directions, to achieve enhanced flexibility in fitting the connector terminals of the power board.

Figure 6:
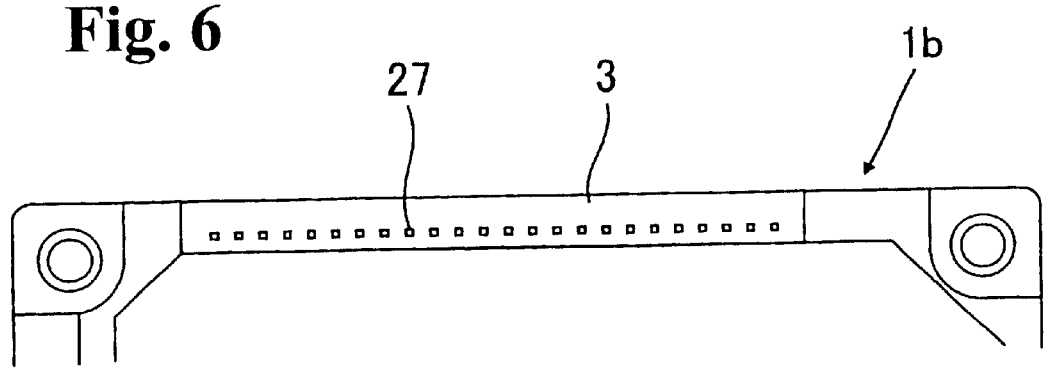
FIG. 6 is a partial plan view of a power module provided with still another control terminal assembly.

FIG. 6 is a partial plan view of a power module provided with still another control terminal assembly. An IGBT intelligent power module 1b comprises a control terminal assembly 3 that is a receptacle-type connector having a plurality of rectangular openings 27 for receiving pins that are male-type terminals from outside, arranged in a longitudinal direction with a predetermined spacing. A contact member is contained in the opening 27 to perform electrical contact with an inserted terminal pin of a rectangular shape.

In the control terminal assembly 3 of the power module 1b also, control terminals connecting to the inner circuit of the power module are not exposed, to avoid deformation during transportation and to eliminate electrostatic break down of the inner circuit element due to inadvertent touching in handling.

As thus far explained, the power module of the present invention comprises the main circuit terminals and the control terminal assembly, wherein the control terminal assembly constitutes the receptacle-type connector. Since the structure does not have any protruding terminal, like a pin, the power module has a compact outside dimension and can be packaged with safety in a small space. The control terminals of the control terminal assembly are disposed in the casing to avoid deformation due to any external force, which facilitates an automatic assembly by a robot. In addition, since the slit-shape openings for receiving the male-type terminals of pin- or tab-shape are provided in two or three directions, flexibility in assembling is enhanced, for example, an error in inserting angle can be absorbed and engaging direction can be freely designed.

While the invention has been explained with reference to the specific embodiments of the invention, the explanation is illustrative and the invention is limited only by the appended claims.

What is claimed is:

1. A semiconductor device, comprising:
   a casing,
   a semiconductor element disposed in the casing, and
   a control terminal assembly situated outside the casing, and having control terminals connected to the semiconductor element and slit-shape openings for receiving therein projecting terminals of a connector, each slit-shape opening having an upper slit and a side slit communicating together so that the projecting terminal can be entered into the slit-shape opening through a desired direction defined by the upper and side slits and moved in the upper and side slits.

2. A semiconductor device according to claim 1, wherein said semiconductor element includes a power device, a driving circuit and a protecting circuit for the power device, said control terminals receiving control signals from the driving circuit and the protecting circuit.

3. A semiconductor device according to claim 2, wherein said control terminal assembly includes a terminal block for holding the control terminals including connection terminals for connecting to the driving circuit and the protecting circuit, and contact members for contacting the projecting terminals, said terminal block being fixed to the casing by one of secondary molding, adhesion and screwing.

4. A semiconductor device according to claim 3, wherein said terminal block has a structure for blocking between the connection terminal and the contact member so that fluid in the casing does not ooze out to the contact member.

5. A semiconductor device according to claim 1, wherein said control terminal assembly includes a housing containing the control terminals therein, said housing being formed integrally with the casing and having the upper and side slits.

6. A semiconductor device according to claim 5, wherein each of said control terminals is formed of two contact plates opposite to each other so that portions between the two contact plates directing the upper and side slits are spaced apart from each other to receive the projecting terminal in the portions between the contact plates.

7. A semiconductor device according to claim 6, wherein said contact plates include protrusions protruding toward each other to hold the projecting terminal therebetween.

8. A semiconductor device according to claim 1, wherein each of said slit-shape openings includes a wide outer portion and narrow inner portion to lead the projecting terminal, said control terminal having two terminal portions on two sides of each of said slit-shape openings.

* * * * *